(12) United States Patent
Nagai et al.

(10) Patent No.: US 10,274,826 B2
(45) Date of Patent: Apr. 30, 2019

(54) METHOD FOR IMPARTING WATER REPELLENCY TO SURFACE OF MEMBER

(71) Applicant: CANON KABUSHIKI KAISHA, Tokyo (JP)

(72) Inventors: Masataka Nagai, Yokohama (JP); Yoshinori Tagawa, Yokohama (JP); Shingo Nagata, Tokyo (JP); Hiroyuki Murayama, Yokohama (JP); Shuhei Oya, Kawasaki (JP); Makoto Watanabe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/172,005

(22) Filed: Jun. 2, 2016

(65) Prior Publication Data

US 2016/0357106 A1    Dec. 8, 2016

(30) Foreign Application Priority Data

Jun. 5, 2015   (JP) ................. 2015-115201

(51) Int. Cl.
  *G03F 7/11*    (2006.01)
  *G03F 7/004*   (2006.01)
  *G03F 7/038*   (2006.01)
  *G03F 7/32*    (2006.01)
  *G03F 7/40*    (2006.01)
  *B41J 2/16*    (2006.01)
  *G03F 7/075*   (2006.01)

(52) U.S. Cl.
  CPC .............. *G03F 7/11* (2013.01); *B41J 2/1603* (2013.01); *B41J 2/1606* (2013.01); *G03F 7/0046* (2013.01); *G03F 7/038* (2013.01); *G03F 7/0757* (2013.01); *G03F 7/325* (2013.01); *G03F 7/40* (2013.01)

(58) Field of Classification Search
  None
  See application file for complete search history.

(56) References Cited

U.S. PATENT DOCUMENTS 4,521,787 A * 6/1985 Yokota ................. B41J 2/1604
                                                     347/65
7,326,524 B2 * 2/2008 Kitahara ............... B41J 2/1606
                                                     347/45

(Continued)

FOREIGN PATENT DOCUMENTS

JP        1783153       *   3/1999
JP    2010-23525 A        2/2010

(Continued)

*Primary Examiner* — Martin J Angebranndt
(74) *Attorney, Agent, or Firm* — Canon U.S.A., Inc. IP Division (57) ABSTRACT

A method for imparting water repellency to a surface of a member includes a step in which a material including a compound containing a fluorine atom is deposited on a surface of a photosensitive resin layer in order to form a member including a material layer; a first exposure step in which the member is exposed to an amount of light with an exposure apparatus in order to form a latent image in the member; a development step in which the member including the latent image is developed; and a second exposure step in which the member is exposed to an amount of light with an exposure apparatus subsequent to the development step.

8 Claims, 7 Drawing Sheets

(56) References Cited

U.S. PATENT DOCUMENTS

| | | | | |
|---|---|---|---|---|
| 8,057,013 B2* | 11/2011 | Kwon | ................... | B41J 2/1603 347/45 |
| 9,150,697 B2* | 10/2015 | Sawada | ................. | B41J 2/1603 |
| 2001/0003460 A1* | 6/2001 | Yoshihira | ............. | B41J 2/14064 347/87 |
| 2001/0008907 A1* | 7/2001 | Imamura | ................ | B41J 2/1601 522/181 |
| 2003/0170401 A1* | 9/2003 | Shimomura | ........... | B41J 2/1606 427/496 |
| 2005/0093924 A1* | 5/2005 | Shiba | .................... | B41J 2/1603 347/45 |
| 2005/0245633 A1* | 11/2005 | Soutar | ................... | B41J 2/1606 522/83 |
| 2008/0007595 A1* | 1/2008 | Krawczyk | .............. | B41J 2/1603 347/47 |
| 2008/0252689 A1* | 10/2008 | Shiba | ....................... | B41J 2/162 347/44 |
| 2010/0007698 A1* | 1/2010 | Shimomura | ........... | B41J 2/1603 347/45 |
| 2010/0233630 A1* | 9/2010 | Watanabe | .............. | B41J 2/1603 430/320 |
| 2010/0252529 A1* | 10/2010 | Hino | ...................... | B41J 2/1603 216/37 |
| 2011/0050785 A1* | 3/2011 | Sawada | ................. | B41J 2/1603 347/20 |
| 2012/0058433 A1* | 3/2012 | Shiba | .................... | G03F 7/0035 430/320 |
| 2012/0086750 A1* | 4/2012 | Hamade | ................. | B41J 2/1603 347/20 |
| 2013/0004668 A1* | 1/2013 | Sato | ....................... | B41J 2/1603 427/259 |
| 2013/0029056 A1* | 1/2013 | Asai | ....................... | B41J 2/1603 427/487 |
| 2013/0029272 A1* | 1/2013 | Ishikura | ................. | B41J 2/1603 430/320 |
| 2013/0323650 A1* | 12/2013 | Horiuchi | ................ | B41J 2/1631 430/320 |
| 2014/0231542 A1* | 8/2014 | Sato | ....................... | B41J 2/1603 239/104 |
| 2014/0309329 A1* | 10/2014 | Sawada | ................ | C09D 5/1675 523/122 |

FOREIGN PATENT DOCUMENTS

| | | | |
|---|---|---|---|
| JP | 2012131212 A | | 7/2012 |
| JP | 2013-237259 | * | 11/2013 |
| WO | 2013/157659 | * | 10/2013 |

* cited by examiner

METHOD FOR IMPARTING WATER REPELLENCY TO SURFACE OF MEMBER

BACKGROUND OF THE INVENTION

Field of the Invention

The present invention relates to a method for imparting water repellency to the surface of a member.

Description of the Related Art

Various members may be required to have a water-repellent surface. An example of such members is a liquid ejection head included in a liquid ejecting apparatus such as an ink jet printer. The liquid ejection head is a portion of a liquid ejecting apparatus from which liquid droplets are ejected. If liquid droplets adhere to a surface of the liquid ejection head in which ejection ports are formed (hereinafter, this surface is referred to as "ejection port surface"), the adhering liquid droplets may affect the direction in which liquid droplets are ejected. In order to prevent this, the ejection port surfaces of liquid ejection heads have been made water repellent.

Japanese Patent Laid-Open No. 2010-23525 discloses a method for imparting water repellency to the ejection port surface of a liquid ejection head. In this method, a photopolymerizable water-repellent layer is formed on a photosensitive resin layer, the photopolymerizable water-repellent layer and the photosensitive resin layer are both subsequently exposed to light and developed (i.e., patterned) by photolithography simultaneously, and the resulting layers are heated to cure the layers. By this method, water repellency is imparted to the ejection port surface in the following manner: an acid is produced in the photopolymerizable water-repellent layer in response to the light emitted in the exposure step; and, when the layers are subsequently heated, water-repelling groups that include a fluorine atom are bonded in a uniform arrangement to the photopolymerizable resin layer.

SUMMARY OF THE INVENTION

The present invention provides a method for imparting water repellency to a surface of a member, the method including a step in which a material including a compound containing a fluorine atom is deposited on a surface of a photosensitive resin layer in order to form a member including the photosensitive resin layer and a material layer including the material, the material layer being disposed on a front surface of the photosensitive resin layer; a first exposure step in which the member is exposed to an amount of light with an exposure apparatus in order to form a latent image in the member; a development step in which the member including the latent image is developed; and a second exposure step in which the member is exposed to an amount of light with an exposure apparatus subsequent to the development step.

Further features of the present invention will become apparent from the following description of exemplary embodiments with reference to the attached drawings.

DESCRIPTION OF THE EMBODIMENTS

By the method described in Japanese Patent Laid-Open No. 2010-23525, it is possible to impart water repellency to the ejection port surface. However, in some cases, the ejection port surface may be required to have further high water repellency. For example, in the case where a liquid having a high viscosity is to be ejected, it is required to increase the water repellency of the ejection port surface from the viewpoint of ejection stability.

Figure 7A:
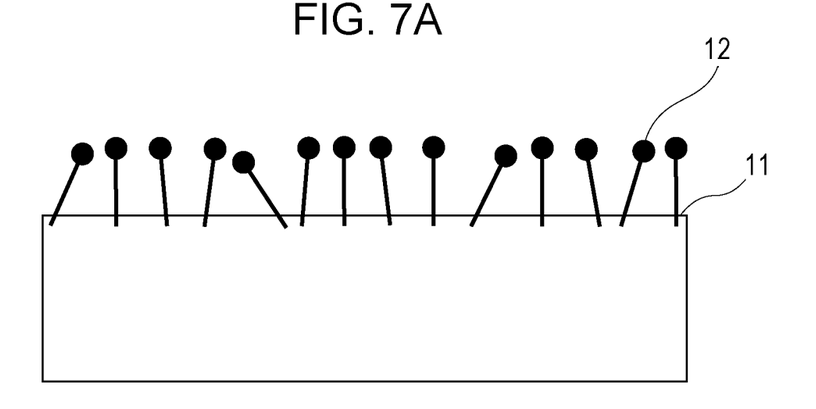
FIGS. 7A and 7B are diagrams illustrating the mechanisms by which water repellency is imparted to a member.

Accordingly, the inventors of the present invention devised a method in which water-repelling groups that include a fluorine atom are arranged uniformly on the ejection port surface by being exposed to a large amount of light. In the case where the amount of light received by the water-repelling groups is small, as illustrated in FIG. 7A, the water-repelling groups 12 are present on the ejection port surface 11, but the energy required to arrange the water-repelling groups 12 regularly becomes insufficient. Even when the water-repelling groups are arranged regularly, they are not bonded to the ejection port surface with stability and the alignment of the water-repelling groups is likely to be lost when, for example, the water-repelling groups are brought into contact with a development solution. Thus, it is not possible to impart sufficiently high water repellency to the ejection port surface.

Figure 7B:
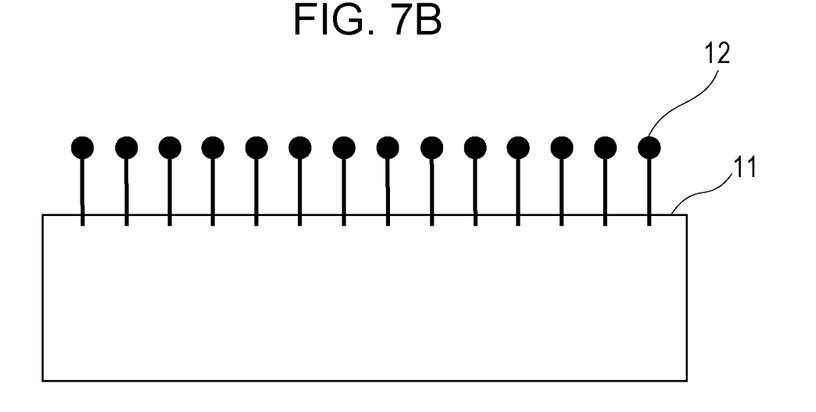

In contrast, in the case where the amount of light received by the water-repelling groups is large, the water-repelling groups 12 are arranged regularly on the ejection port surface 11 as illustrated in FIG. 7B and sufficiently high water repellency is imparted to the ejection port surface. Furthermore, the water-repelling groups 12 can be bonded to the ejection port surface 11 in a suitable manner. This reduces the likelihood of the alignment of the water-repelling groups 12 being lost. Thus, it is possible to impart sufficiently high water repellency to the ejection port surface.

However, as described in Japanese Patent Laid-Open No. 2010-23525, in the case where a photosensitive resin layer to be patterned by photolithography is made water repellent, water repellency is imparted to the photosensitive resin layer at the time of patterning the photosensitive resin layer. Studies conducted by the inventors confirmed that, in such a case, increasing the amount of light received by the member may reduce the accuracy with which the member is patterned (hereinafter, this accuracy is referred to as "patterning accuracy") in response to light reflected by, for example, the base (i.e., a substrate, or a layer on the substrate) of the photosensitive resin layer. In other words, in the case where a water-repellent layer is formed on a photosensitive resin layer that is to be patterned, there is a tradeoff between increasing the water repellency of the surface of the photosensitive resin layer and enhancing the patterning accuracy.

Accordingly, an embodiment of the present invention provides a method for imparting water repellency to the surface of a member while enhancing the accuracy with which the member is patterned by photolithography.

The method for imparting water repellency to the surface of a member according to an embodiment is described below using a liquid ejection head as an example.

Figure 1:
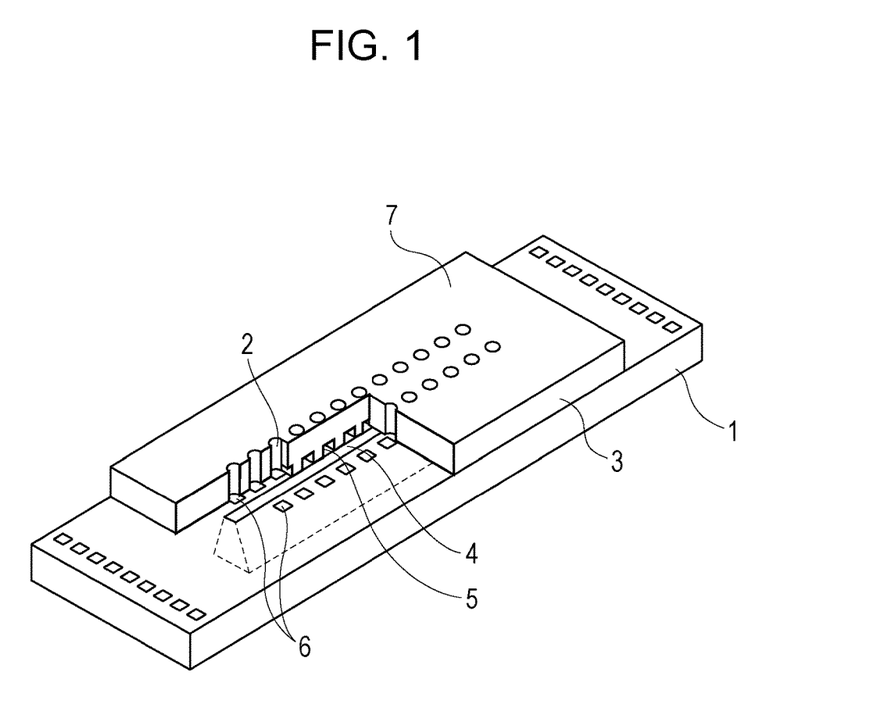
FIG. 1 is a diagram illustrating a liquid ejection head.

FIG. 1 is a perspective view of a liquid ejection head, which includes a substrate 1 and an ejection-port-forming member 3 disposed on the substrate 1. Ejection ports 2 are formed in the ejection-port-forming member 3. The substrate 1 is composed of silicon or the like. A supply port 4 is formed in the substrate 1 so as to penetrate through the substrate 1. A liquid is fed to channels 5 through the supply port 4. The substrate 1 includes energy-generating elements 6 disposed thereon, each of which includes an electrothermal conversion element (i.e., a heater) or a piezoelectric element. Portions of the channels 5 in which the respective energy-generating elements 6 are disposed each serve as a pressure chamber. A liquid is energized by the energy-generating elements 6 disposed in the respective pressure chambers and ejected from the ejection ports 2 toward a recording medium or the like. The surface of the ejection-port-forming member 3 in which the ejection ports 2 are formed, i.e., an ejection port surface 7, has been made water repellent.

FIGS. 2A to 2D illustrate a method for producing a liquid ejection head. The method for producing a liquid ejection head includes a step in which water repellency is imparted to the ejection port surface, which corresponds to a step in which water repellency is imparted to the surface of a member.

Figure 2A:
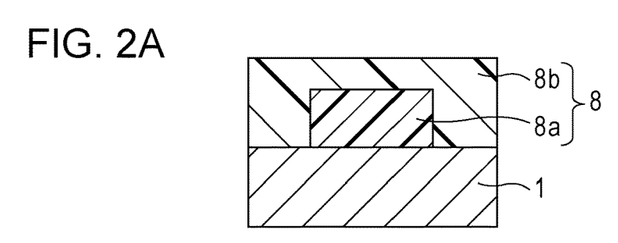
FIGS. 2A to 2D are diagrams illustrating a method for producing a liquid ejection head.

A photosensitive resin layer 8 is formed on a substrate 1 as illustrated in FIG. 2A. The photosensitive resin layer 8 includes a lower layer 8a and an upper layer 8b.

The lower layer 8a is removed with a development solution, and a space corresponding to the former lower layer 8a serves as a pressure chamber. The lower layer 8a may be composed of a positive photosensitive resin. Examples of the positive photosensitive resin include polymethyl isopropenyl ketone, polymethyl methacrylate, and polymethyl glutarimide.

Ejection ports are formed in the upper layer 8b, and the upper layer 8b is thereby formed into an ejection-port-forming member. The upper layer 8b may be composed of a negative photosensitive resin. Examples of the negative photosensitive resin include epoxy resins, vinyl ethers, and oxetanes. Examples of the epoxy resins include bisphenol A epoxy resins and novolac epoxy resins. Examples of commercially available epoxy resins include "Celloxide 2021", "GT-300 Series", "GT-400 Series", and "EHPE3150" produced by Daicel Corporation; "157S70" produced by Japan Epoxy Resin; "EPICLON N-865" produced by DIC Corporation; and "SU-8" produced by Nippon Kayaku Co., Ltd. The above materials may be used alone or two or more may be used in combination. The epoxy equivalent of the epoxy resin is preferably 2,000 or less and is more preferably 1,000 or less. When the epoxy equivalent of the epoxy resin is 2,000 or less, a sufficiently high crosslink density may be achieved in a curing reaction and, after being cured, the glass transition temperature of the epoxy resin does not decrease. This makes it possible to achieve high adhesion. The epoxy equivalent of the epoxy resin is preferably 50 or more. The epoxy equivalent of the epoxy resin is determined in accordance with JIS K-7236. The upper layer 8b may be composed of a material that is solid at 35° C. or less, because a coating film having high fluidity may reduce resolution.

The upper layer 8b may include a photopolymerization initiator. Examples of the photopolymerization initiator include ionic onium salts such as sulfonium salts and iodonium salts; and sulfonic acid compounds. Examples of such photopolymerization initiators that are commercially available include "ADEKA OPTOMER SP-170", "ADEKA OPTOMER SP-172", and "SP-150" produced by ADEKA CORPORATION; "BBI-103" and "BBI-102" produced by Midori Kagaku Co., Ltd.; and "IBPF", "IBCF", "TS-01", and "TS-91" produced by SANWA Chemical Co., Ltd. The above photopolymerization initiators may be used alone or two or more may be used in combination. The photopolymerization initiator included in the upper layer 8b generates an acid, which diffuses in the upper layer 8b. This may contribute to impartation of good water repellency to the ejection port surface.

The upper layer 8b may also include basic substances such as amines; photosensitizing substances such as anthracene derivatives; a silane coupling agent; and the like in order to, for example, increase ease of photolithography and enhance adhesion. Commercially available negative resists such as "SU-8 Series" and "KMPR-1000" produced by Kayaku MicroChem Corporation; and "TMMRS2000" and "TMMF S2000" produced by TOKYO OHKA KOGYO CO., LTD. may also be used.

The upper layer 8b may be formed by, for example, dissolving an appropriate amount of photocationic-curable resin in a solvent and applying the resulting solution by spin coating to the substrate 1 on which the lower layer 8a is disposed. In the case where a solvent is used, a solvent in which the lower layer 8a is poorly soluble may be selected.

Although the photosensitive resin layer comprises two layers in the above-described example embodiment, the photosensitive resin layer may alternatively comprise three or more layers or one layer. In any of these cases, the layer in which the ejection ports are to be formed may be a negative photosensitive resin layer composed of a negative photosensitive resin.

Figure 2B:
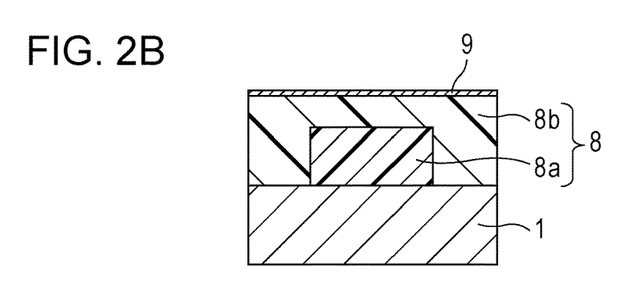

As illustrated in FIG. 2B, a material including a compound containing a fluorine atom is deposited on the surface of the photosensitive resin layer 8 in order to form a material layer 9. Thus, the material layer 9 may comprise the material including a compound containing a fluorine atom on the front surface of the photosensitive resin layer 8. Examples of the compound containing a fluorine atom include a condensate of a hydrolyzable silane compound including a fluorine atom with a hydrolyzable silane compound including a cationic polymerizable group; and a condensate of a hydrolyzable silane compound including an epoxy group with a hydrolyzable silane compound including a perfluoropolyether group. The compound containing a fluorine atom is mixed with a solvent and the like to prepare a material including the compound containing a fluorine atom. This material may include a photopolymerization initiator. In the case where the photosensitive resin layer 8 includes a photopolymerization initiator, the photopolymerization initiator is not necessarily added to the material because, in such a case, the photosensitive resin layer 8 may also generate an acid. This material may further include a resin such as an epoxy resin, an additive, and the like.

For depositing the material including the compound containing a fluorine atom on the surface of the photosensitive resin layer 8, spin coating, spray coating, and the like may be employed. By depositing the material on the surface of the photosensitive resin layer 8, a material layer 9 is formed on the front surface of the photosensitive resin layer 8. The term "the front surface of the photosensitive resin layer 8" used herein refers to, in FIG. 2B, the surface of the photosensitive resin layer 8 that is the furthest from the substrate 1, that is, a surface of the photosensitive resin layer 8 in which ejection ports are to be formed. The material layer 9 may be stacked on the surface of the photosensitive resin layer 8. Alternatively, the above-described material may permeate the photosensitive resin layer 8 from the surface such that the material layer 9 is formed in a region of the photosensitive resin layer 8 which extends along the surface of the photosensitive resin layer 8. In the case where the material layer 9 is stacked on the photosensitive resin layer 8, portions of the material layer 9 and the photosensitive resin layer 8 may overlap each other. That is, although the material layer 9 and the photosensitive resin layer 8 are "layers", the boundary therebetween is not necessarily well defined.

Figure 2C:
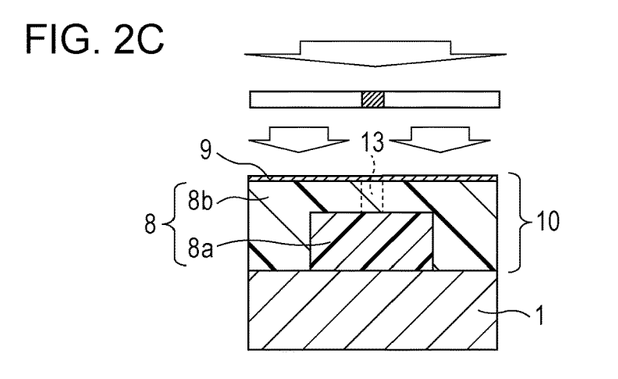

A member 10 including the photosensitive resin layer and the material layer disposed on the front surface of the photosensitive resin layer is exposed to light as illustrated in FIG. 2C. For example, the member 10 is exposed to i-line radiation by using an exposure apparatus. By exposing the member 10 to light by using an exposure apparatus, a latent image is formed in the member 10. Specifically, a latent image of the ejection ports is formed.

Figure 2D:
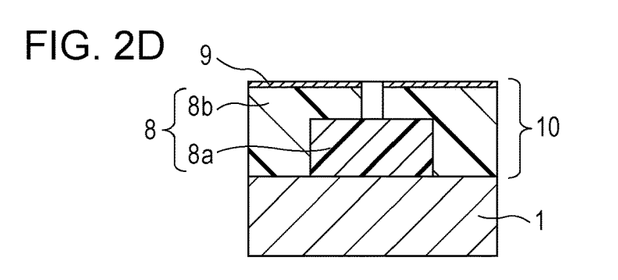

The member including the latent image is developed as illustrated in FIG. 2D (development step). In the development step, the member 10 is heated (i.e., prebaked), and an uncured portion 13 of the member 10 is subsequently removed with a development solution. Specifically, the ejection ports 2 are formed in the member 10 with a development solution, and the member 10 is thereby formed into the ejection-port-forming member 3.

The member 10 is reheated to be cured (hereinafter, this process is referred to as "initial heat curing"). Subsequently, a supply port is formed in the substrate 1 as needed, and the lower layer 8b is removed by ultrasonic dissolving or the like in order to form pressure chambers. Initial heat curing is performed in order to reduce the likelihood of the pattern formed in the member 10 being deformed when, for example, the lower layer 8b is removed. Note that care must be taken not to heat the member 10 excessively because, for example, the lower layer 8b needs to be removed. In this initial heat curing step, the member is heated at 120° C. or more and 160° C. or less for 2 minutes or more and 20 minutes or less.

The member 10 is again heated to be cured (hereinafter, this process is referred to as "final heat curing"). The final heat curing step is a step in which the member 10 is heated sufficiently in order to complete the formation of the liquid ejection head. Therefore, the member 10 needs to be strongly heated. In this final heat curing step, the member is heated at 170° C. or more and 220° C. or less for 30 minutes or more and 120 minutes or less.

A liquid ejection head having a water-repellent ejection port surface can be produced by the above-described method.

Figure 3:
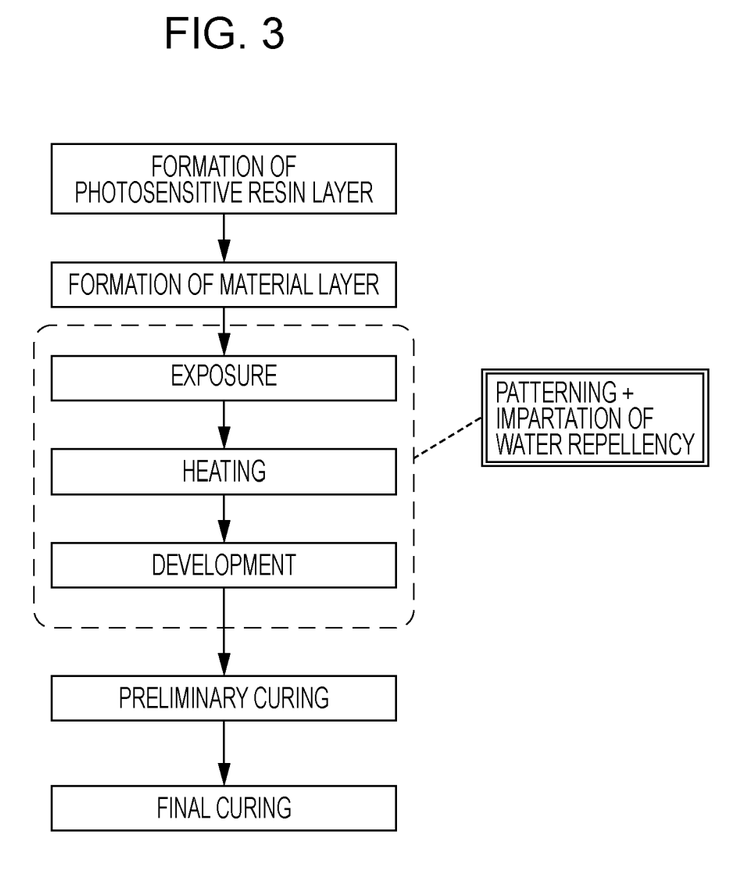
FIG. 3 is a flow diagram illustrating a method for producing a liquid ejection head.

FIG. 3 illustrates a simplified flow diagram illustrating the above-described steps. In the flow diagram illustrated in FIG. 3, patterning of the member 10 and the impartation of water repellency to the ejection port surface are performed in the exposure, heating, and development steps. Increasing the amount of light emitted in the exposure step increases the water repellency of the ejection port surface as described above with reference to FIG. 7, but also reduces the patterning accuracy because the amount of light reflected on the base (e.g., the substrate 1) is increased and portions of the member that are not intended to be exposed to light are irradiated with the reflected light.

Accordingly, in this embodiment, an exposure step for patterning the member and an exposure step for imparting water repellency to the surface of the member are conducted separately. Specifically, the exposure step for patterning the member (hereinafter, referred to as "first exposure step") is conducted, and patterning of the member is completed in the following development step. Subsequent to the development step, the exposure step for imparting water repellency to the surface of the member (hereinafter, referred to as "second exposure step") is conducted. The first and second exposure steps are both conducted with an exposure apparatus. The term "exposure apparatus" used herein refers to an apparatus with which an object placed on a stage or the like can be exposed to a predetermined amount of light, but not a common exposure apparatus including a fluorescent lamp or the like.

Figure 4A:
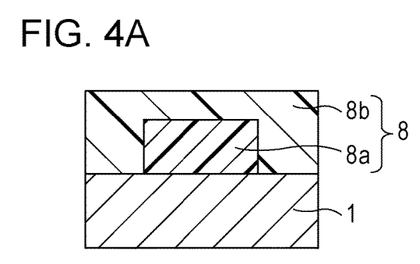
FIGS. 4A to 4F are diagrams illustrating a method for producing a liquid ejection head.
Figure 4B:
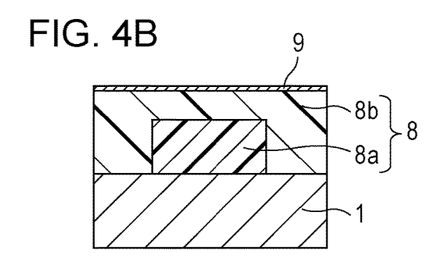

FIGS. 4A to 4F illustrate a method for producing a liquid ejection head according to the embodiment. FIG. 5 is the flow diagram illustrating the method for producing a liquid ejection head according to the embodiment. The steps for forming a material layer which are illustrated in FIGS. 4A and 4B are the same as those described above with reference to FIGS. 2A and 2B.

Figure 4C:
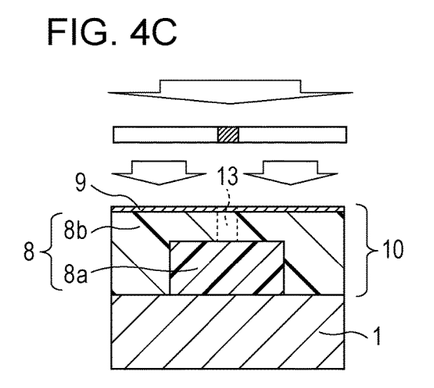
Figure 5:
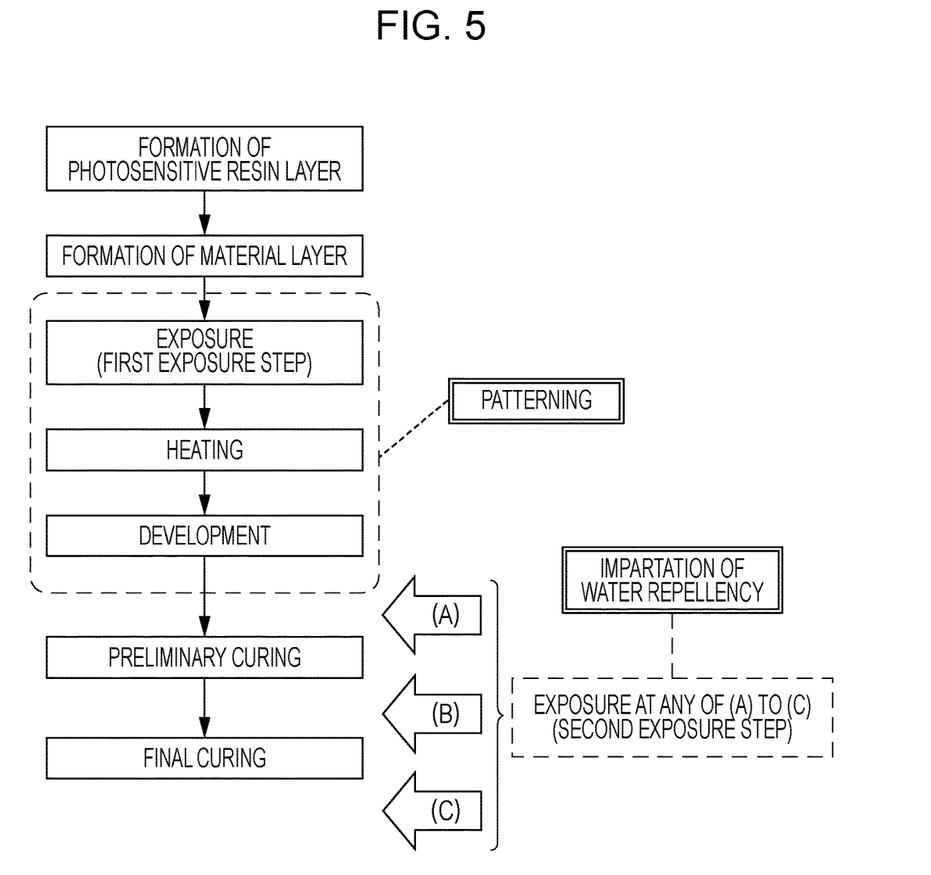
FIG. 5 is a flow diagram illustrating a method for producing a liquid ejection head.

After the formation of the material layer, the member 10 is exposed to light with an exposure apparatus as illustrated in FIG. 4C (first exposure step). The first exposure step is conducted for patterning the member 10. The amount of light received by the surface of the member 10 in the first exposure step is preferably, but varies depending on the composition and the like of the member 10, 0.2 J/cm$^2$ or more in order to pattern the member 10. The amount of light received by the surface of the member 10 in the first exposure step is preferably 1.0 J/cm$^2$ or less. Setting the amount of light received by the surface of the member 10 to 1.0 J/cm$^2$ or less reduces the amount of reflected light and increases the accuracy with which the member 10 is patterned.

Figure 4D:
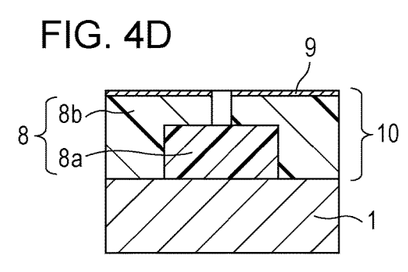

The member including the latent image is developed as illustrated in FIG. 4D (development step). In the development step, the member 10 is heated (i.e., prebaked), and an uncured portion 13 of the member 10 is subsequently removed with a development solution. Specifically, the ejection ports 2 are formed in the member 10 with a development solution, and the member 10 is thereby formed into the ejection-port-forming member 3.

Figure 4E:
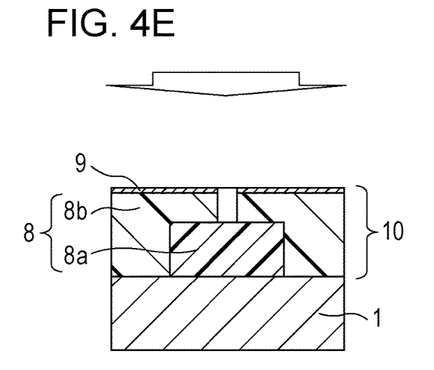
Figure 4F:
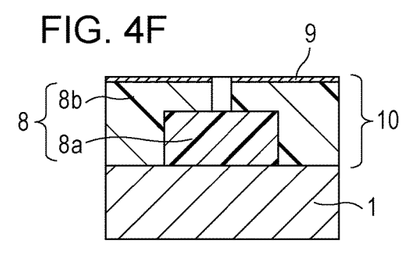

In this embodiment, the exposure step for imparting water repellency to the surface of the member (second exposure step) illustrated in FIG. 4E is conducted subsequent to the development step. In the second exposure step, the surface of the member is exposed to light with an exposure apparatus. The amount of light received by the surface of the member in the second exposure step is preferably 0.5 J/cm$^2$ or more. The total amount of light received by the surface of the member in the first and second exposure steps is preferably 1.5 J/cm$^2$ or more. This enables water repellency to be imparted to the surface of the member in a suitable manner. Conducting the second exposure step for a long period of time may reduce productivity. Therefore, in the second exposure step, it is preferable to expose the surface of the member to light such that the amount of light received by the surface of the member reaches 1.0 J/cm$^2$ or more within 1 hour.

Water repellency is imparted to the surface of the member by the second exposure step. Specifically, the contact angle of pure water on the surface of the member is preferably increased by 3° or more by conducting the second exposure step compared with the case where the second exposure step is not conducted. As illustrated in the flow diagram of FIG. 5, the second exposure step is conducted subsequent to the development step. Examples of steps conducted subsequent to the development step include curing (i.e., initial heat curing) of the member 10, formation of a supply port in the substrate 1, removal of the lower layer 8b, and recuring (i.e., final heat curing) of the member 10. The second exposure step may be conducted at any timing selected from (A), (B), and (C) illustrated in FIG. 5. In other words, the second exposure step may be conducted at any timing subsequent to the development step. That is, the second exposure step may be conducted prior to initial heat curing. Alternatively, the second exposure step may be conducted subsequent to initial heat curing and prior to final heat curing. In another example embodiment, the second exposure step may be conducted subsequent to final heat curing. In particular, the second exposure step is preferably conducted at the timing (B), that is, subsequent to initial heat curing and prior to final heat curing.

A step in which the member is heated, this step being a step other than the initial heat curing step or final heat curing, may be conducted subsequent to the second exposure step. Specifically, the member is preferably heated at 80° C. or more for 1 minute or more. This makes it possible to impart water repellency to the surface of the member in a more suitable manner.

Figure 6:
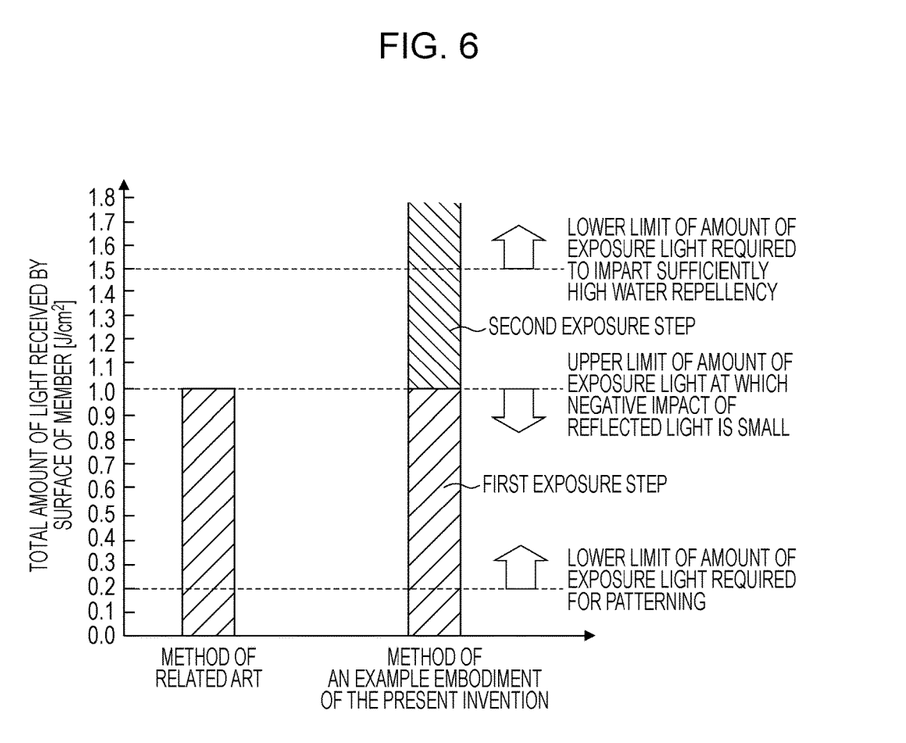
FIG. 6 is a diagram illustrating the relationship between the amount of light received by the surface of a member, the accuracy with which the member is patterned, and the water repellency of the member.

FIG. 6 illustrates the relationship between the amount of light received by the surface of the member, the accuracy with which the member is patterned, and the water repellency of the surface of the member. FIG. 6 shows that the minimum amount of light received by the surface of the member which is required to pattern the member is 0.2 J/cm²; the amount of light received by the surface of the member at which the patterning accuracy starts significantly decreasing in response to the reflected light is 1.0 J/cm² or more; and the amount of light received by the surface of the member at which sufficiently high water repellency is imparted to the surface of the member is 1.5 J/cm² or more.

If the amount of light received by the surface of the member is 1.0 J/cm² or more, the patterning accuracy may be reduced in response to the reflected light. Accordingly, the amount of light received by the surface of the member needs to be smaller than 1.0 J/cm². Therefore, it is difficult to impart sufficiently high water repellency to the surface of the member by exposing the member to light in accordance with the method of the related art. On the other hand, in the method according to the example embodiment of the present invention, the amount of light received by the surface of the member in an exposure step (first exposure step) conducted prior to the development step, that is, prior to patterning of the member, is set to be smaller than 1.0 J/cm². This prevents the patterning accuracy from decreasing. In addition, after patterning of the member has been completed, that is, the development step has been conducted, the total amount of light received by the surface of the member is increased by conducting the second exposure step. This makes it possible to impart sufficiently high water repellency to the surface of the member. The development step has been terminated, that is, patterning of the surface of the member has been completed, before the second exposure step is conducted. Therefore, increasing the total amount of light received by the surface of the member does not reduce the patterning accuracy in principle. Increasing the amount of light received by the surface of the member enables water-repelling groups that include a fluorine atom to be arranged regularly on the surface of the member. This enables sufficiently high water repellency to be imparted to the surface of the member. Furthermore, the water-repelling groups can be bonded to the surface of the member in a suitable manner, and the alignment of the water-repelling groups is not likely to be lost. This also enables sufficiently high water repellency to be imparted to the surface of the member.

EXAMPLES

The embodiment of the present invention is further described in detail with reference to Examples below.

Example 1

A photosensitive resin layer 8 including a lower layer 8a and upper layer 8b which was disposed on a silicon substrate 1 as illustrated in FIG. 4A was prepared.

Specifically, the substrate 1 was spin-coated with a solution prepared by dissolving polymethyl isopropenyl ketone, which served as a positive photosensitive resin, in ethyl acetoacetate. The resulting coating film was baked to form a positive photosensitive resin layer. The thickness of the positive photosensitive resin layer was 14 µm. Subsequently, the positive photosensitive resin layer was irradiated with ultraviolet light through a mask in order to perform pattern exposure of the positive photosensitive resin layer. The exposed portions of the positive photosensitive resin layer were dissolved with a mixed solvent of propylene glycol methyl ether acetate and methyl isobutyl ketone in order to perform development. Thus, a lower layer 8a was formed.

Subsequently, 100 parts by mass of a photocationic curable resin "EHPE3150" produced by Daicel Corporation and 6 parts by mass of a photocationic polymerization initiator "SP-172" produced by ADEKA CORPORATION were dissolved in 80 parts by mass of xylene, which served as a solvent. The resulting solution was applied to the lower layer 8a and the substrate 1 by spin coating to form an upper layer 8b having a thickness of 25 µm.

A material including a compound containing a fluorine atom was deposited on the surface of the photosensitive resin layer 8 as illustrated in FIG. 4B to form a material layer 9 including the material including a compound containing a fluorine atom on the front surface of the photosensitive resin layer 8.

Specifically, a condensate of a hydrolyzable silane compound including an epoxy group with a hydrolyzable silane compound including a perfluoropolyether group was prepared by the following method.

Into a flask equipped with a cooling tube, 12.53 g (0.045 mol) of γ-glycidoxypropyltriethoxysilane, 8.02 g (0.045 mol) of methyltriethoxysilane, 1.05 g (0.00091 mol) of the compound represented by Formula (1) below, 5.95 g of water, 13.4 g of ethanol, and 4.20 g of a hydrofluoroether "HFE7200" produced by Sumitomo 3M Ltd. were charged. The resulting mixture was stirred in the flask for 5 minutes at room temperature.

(1)

where g represents an integer of 1 to 30.

The mixture was heated to reflux for 24 hours in order to prepare a condensate. This condensate is the compound containing a fluorine atom. The condensate was diluted with 2-butanol/ethanol so as to form a solution having an active component concentration of 7% by mass. The diluted solution, which served as a material including a compound containing a fluorine atom, was applied to the uncured photosensitive resin layer 8 with a slit coater so as to form a material layer 9 on the surface of the photosensitive resin layer.

A member 10 including the photosensitive resin layer 8 and the material layer 9 disposed on the front surface of the photosensitive resin layer 8 was exposed to light as illustrated in FIG. 4C (first exposure step). In the first exposure step, an i-line stepper "FPA-3000i5+" produced by CANON KABUSHIKI KAISHA was used as an exposure apparatus. The amount of light received by the surface of the member 10 was set to 0.5 J/cm$^2$ (wavelength: 365 nm). Thus, a latent image of ejection ports was formed in the member 10.

The member 10 was then developed with a liquid mixture of methyl isobutyl ketone and xylene and subsequently rinsed with isopropanol (development step). Thus, ejections ports were formed in the member 10. Thereby, the member 10 was formed into an ejection-port-forming member, and the surface of the member 10 was formed into an ejection port surface.

The second exposure step was conducted subsequent to the development step and prior to initial heat curing, that is, at the timing (A) illustrated in FIG. 5. The second exposure step was conducted under the following conditions by using a high-pressure UV lamp "UX3300" produced by USHIO INC. as an exposure apparatus:

Amount of light received by the surface of the member: 1.5 J/cm$^2$ (wavelength: 270 to 400 nm)

Heating conditions: 140° C., 4 minutes

Subsequent to the second exposure step, the member 10 was heated at 140° C. for 4 minutes (initial heat curing). Then, a supply port was formed in the substrate 1 by dry etching. The member 10 was irradiated with ultraviolet light and subsequently immersed in methyl lactate in order to remove the lower layer 8b.

The contact angle of pure water on the surface of the member 10 which was measured with a contact angle meter "DropMeasure" produced by MICROJET Corporation subsequent to initial heat curing was 94°.

The member 10 was further heated at 200° C. for 60 minutes (final heat curing). Thus, a liquid ejection head having a water-repellent ejection port surface was prepared.

The shapes of the ejection ports formed in the ejection port surface of the ejection-port-forming member included in the liquid ejection head were observed with an electron microscope. It was confirmed that distortion of the ejection ports which was considered to be caused in response to the reflected light was absent and ejection ports having a good shape were formed.

In Example 1, the second exposure step was conducted prior to initial heat curing. This reduced the amount of energy required to increase water repellency.

Comparative Example 1

A liquid ejection head was prepared as in Example 1, except that the second exposure step was omitted in Comparative Example 1. The contact angle of pure water on the surface of the member 10 which was measured as in Example 1 subsequent to initial heat curing was 91°.

Example 2

A liquid ejection head was prepared as in Example 1, except that, in Example 2, the second exposure step was conducted subsequent to initial heat curing and prior to final heat curing, that is, at the timing (B) illustrated in FIG. 5.

A liquid ejection head was prepared as in Example 1, except that, in Example 2, the second exposure step was conducted subsequent to preliminary curing and prior to final curing, that is, at the timing (B) illustrated in FIG. 5.

The contact angle of pure water on the surface of the member 10 which was measured as in Example 1 subsequent to the second exposure step was 95°.

The shapes of the ejection ports formed in the ejection port surface of the ejection-port-forming member included in the liquid ejection head were observed with an electron microscope. It was confirmed that distortion of the ejection ports which was considered to be caused in response to the reflected light was absent and ejection ports having a good shape were formed.

While the second exposure step was conducted prior to initial heat curing in Example 1, the second exposure step was conducted subsequent to initial heat curing in Example 2. In the case where the second exposure step is conducted prior to initial heat curing, the water repellency of the surface of the member may be reduced in response to, for example, an etchant used for etching the substrate in the subsequent step. In contrast, in the case where the second exposure step is conducted after initial heat curing has been done as in Example 2, the likelihood of the water repellency of the surface of the member being reduced due to the above factors may be advantageously reduced.

Comparative Example 2

A liquid ejection head was prepared as in Example 2, except that the second exposure step was omitted in Comparative Example 2. The contact angle of pure water on the surface of the member 10 which was measured as in Example 2 subsequent to the second exposure step was 92°.

Example 3

A liquid ejection head was prepared as in Example 1, except that, in Example 3, the second exposure step was conducted subsequent to final heat curing, that is, at the timing (C) illustrated in FIG. 5 and the amount of light received by the surface of the member in the second exposure step was changed to 2.0 J/cm$^2$.

The contact angle of pure water on the surface of the member 10 which was measured as in Example 1 subsequent to the second exposure step was 94°.

The shapes of the ejection ports formed in the ejection port surface of the ejection-port-forming member included in the liquid ejection head were observed with an electron microscope. It was confirmed that distortion of the ejection ports which was considered to be caused in response to the reflected light was absent and ejection ports having a good shape were formed.

It was also possible to impart water repellency to the surface of the member in a suitable manner in Example 3. However, since the second exposure step was conducted subsequent to final heat curing, in Example 3, the amount of energy required to increase the water repellency of the surface of the member to the desired level was larger than in Example 1 or 2.

Comparative Example 3

A liquid ejection head was prepared as in Example 3, except that the second exposure step was omitted in Comparative Example 3. The contact angle of pure water on the surface of the member 10 which was measured as in Example 3 subsequent to the second exposure step was 920.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2015-115201, filed Jun. 5, 2015, which is hereby incorporated by reference herein in its entirety.

What is claimed is:

1. A method for imparting water repellency to an ejection port surface of a liquid ejection head, the ejection port surface being a surface of the liquid ejection head on which an ejection port is formed, the method comprising:
 a step in which a material including a compound containing a fluorine atom is deposited on a surface of a photosensitive resin layer on a substrate, the surface of the photosensitive resin layer serving as an ejection port surface, in order to form a member including the photosensitive resin layer and a material layer including the material, the material layer being disposed on a front surface of the photosensitive resin layer;
 a first exposure step in which a surface of the member is exposed to an amount of light with an exposure apparatus in order to form a latent image in the photosensitive resin layer and the material layer of the member;
 a development step in which the member including the latent image is developed, thereby removing the photosensitive resin layer and the material layer within the latent image, the ejection port being formed at a portion where the member has been removed;
 an initial curing step in which the member is initially cured after the development step, wherein, in the initial curing step, the member is heated at 120° C. or more and 160° C. or less for 2 minutes or more and 4 minutes or less;
 a second exposure step in which the surface of the member is exposed to an amount of light with an exposure apparatus subsequent to the development step and the initial curing step, wherein exposure in the second exposure step is incident from the same side as the first exposure and imparts water repellency to the member and thereby increasing a contact angle of pure water on the surface of the member by 3° or more;
 a supply port forming step in which a supply port is formed by etching the substrate after the second exposure step;
 an ultraviolet light irradiation step in which the member is irradiated with ultraviolet light after the supply port forming step;
 a member removal step in which a part of the member is removed after the ultraviolet light irradiation step; and
 a final heat curing step in which the member is cured after the member removal step, and in which the member is heated at 170° C. or more and 220° C. or less for 30 minutes or more and 120 minutes or less.

2. The method for imparting water repellency to an ejection port surface of a liquid ejection head according to claim 1,
 wherein the amount of light received by the surface of the member in the first exposure step is 1.0 J/cm2 or less.

3. The method for imparting water repellency to an ejection port surface of a liquid ejection head according to claim 1,
 wherein a total amount of light received by the surface of the member in the first exposure step and the second exposure step is 1.5 J/cm2 or more.

4. The method for imparting water repellency to an ejection port surface of a liquid ejection head according to claim 1,
 wherein a contact angle of pure water on the surface of the member is increased by 3° or more as compared with a contact angle of pure water on a surface of a second member subjected to a method for imparting water repellency in which the second exposure step is not conducted.

5. The method for imparting water repellency to an ejection port surface of a liquid ejection head according to claim 1,
 wherein, in the second exposure step, the member is exposed to light such that the amount of light received by the surface of the member reaches 1.0 J/cm2 or more within 1 hour.

6. The method for imparting water repellency to an ejection port surface of a liquid ejection head according to claim 1, wherein the supply port is formed by dry etching.

7. The method for imparting water repellency to an ejection port surface of a liquid ejection head according to claim 1,
 wherein the amount of light received by the surface of the member in the second exposure step is 0.5 J/cm2 or more.

8. The method for imparting water repellency to an ejection port surface of a liquid ejection head according to claim 1,
 wherein the member is heated at 80° C. or more for 1 minute or more after the second exposure step and before the supply port forming step.

* * * * *